United States Patent [19]

Higuchi

[11] 4,408,168
[45] Oct. 4, 1983

[54] DELAY CIRCUIT OSCILLATOR HAVING UNEQUAL ON AND OFF TIMES

[75] Inventor: Mitsuo Higuchi, Tokyo, Japan

[73] Assignee: Fujitsu Limited, Kawasaki, Japan

[21] Appl. No.: 210,676

[22] Filed: Nov. 26, 1980

[30] Foreign Application Priority Data

Nov. 29, 1979 [JP] Japan ................................ 54-154579

[51] Int. Cl.$^3$ ......................... H03K 3/03; H03K 3/354
[52] U.S. Cl. ...................................... 331/57; 307/602; 307/605; 331/111
[58] Field of Search ...................... 331/57, 111, 108 C, 331/108 D, 108 B; 307/501, 602, 605

[56] References Cited

U.S. PATENT DOCUMENTS

| 4,008,406 | 2/1977 | Kawagoe | .................... 331/108 B X |
| 4,115,710 | 9/1978 | Lou | ..................................... 307/304 |
| 4,122,361 | 10/1978 | Clemen et al. | ....................... 307/208 |

FOREIGN PATENT DOCUMENTS 2548191  5/1976  Fed. Rep. of Germany ...... 331/111

2118357  7/1972  France .
2290089  5/1976  France .

OTHER PUBLICATIONS

Chang, "Integrated Delay Circuit/Noise Rejection Circuit", IBM Technical Disclosure Bulletin, vol. 16, No. 1, Jun. 1973, pp. 317–318.

Primary Examiner—Siegfried H. Grimm
Attorney, Agent, or Firm—Staas & Halsey

[57] ABSTRACT

An oscillation circuit for providing an oscillation output having a duty ratio different from 50%. The oscillation circuit is adapted to control, for example, a bootstrap circuit included in an EPROM which is erasable by means of ultraviolet rays. The oscillation circuit is comprised of a depletion type MOS transistor used as a resistance in each CR time constant circuit; the gate and the drain or the gate and the source of each depletion type MOS transistor being connected together and the oscillation circuit comprising a delay circuit having its output positively fed back to its input.

6 Claims, 5 Drawing Figures

DELAY CIRCUIT OSCILLATOR HAVING UNEQUAL ON AND OFF TIMES

BACKGROUND OF THE INVENTION

This invention relates to an oscillation circuit for providing an oscillation output having a duty ratio different from 50%, and more particularly to an oscillation circuit for controlling, for example, a bootstrap circuit included in an EPROM (Erasable Programmable Read Only Memory) which is erasable by means of ultraviolet rays.

In general, a package for mounting an EPROM which is erasable by means of ultraviolet rays is provided with a window for allowing ultraviolet rays to be radiated on the EPROM. During erasing of the stored contents, ultraviolet rays are radiated on the EPROM through the window. However, during writing of data in the EPROM, external light rays may also penetrate through the window to radiate on the EPROM, so that the light rays incident on junction capacitances in a bootstrap circuit included in the EPROM may cause leakage of charges stored in the junction capacitance, resulting in that the write-in voltage is lowered to a level insufficient to write in data. In order to avoid this lowering of the write-in voltage, an oscillation circuit is usually included in the EPROM, so that the junction capacitances are repeatedly charged up during the writing.

In a conventional oscillation circuit, the output signal has a duty ratio substantially equal to 50%. Therefore, within one period of the output frequency, the interval of a high potential is substantially equal to the inteval of a low potential. When the output of this oscillation circuit is connected to the input of the bootstrap circuit in the EPROM, the high potential interval and the low potential interval usually correspond to a programmable interval and a reset interval, respectively, as hereinafter described in detail. Accordingly, by the use of the conventional oscillation circuit, the programmable interval, or in other words, the write-in interval, is substantially equal to the reset interval, or, the interval for charging junction capacitances included in the bootstrap circuit.

However, for the purpose of increasing the write-in efficiency, the write-in interval is required to be as long as possible and the reset interval is required to be as short as possible. To this end, the input of the bootstrap circuit should preferably receive an oscillation signal having a duty ratio different from 50%. To obtain such a signal having a duty ratio different from 50%, a combination of frequency dividers is connected to the output of the conventional oscillation circuit. However, such a prior art technique has disadvantages in that a number of frequency dividers are required, causing the cost to be increased as well as necessitating the troublesome task of making frequency dividers for obtaining the desired duty ratio.

SUMMARY OF THE INVENTION

Therefore, it is an object of the present invention to provide an oscillation circuit for achieving a high write-in efficiency of an EPROM which is erasable by means of ultraviolet rays.

Another object of the present invention is to provide an oscillation circuit for providing an oscillation output having a duty ratio different from 50%.

Still another object of the present invention is to provide an oscillation circuit by which the cost of an EPROM erasable by means of ultraviolet rays is lowered.

A still further object of the present invention is to provide an oscillation circuit by which an EPROM is simplified by eliminating the necessity of frequency dividers.

According to the present invention, an oscillation circuit for providing an oscillation output having a desired duty ratio comprises a delay circuit, the output of the delay circuit being positively fed back to the input of the delay circuit, the delay circuit being comprised of at least one inverter and at least one CR time constant circuit, connected to the output of the inverter, characterized in that the CR time constant circuit is comprised of a depletion type MOS transistor and a capacitance, the gate of the MOS transistor being connected to the drain or to the source of the MOS transistor.

BRIEF DESCRIPTION OF THE DRAWINGS

The invention will now be described by way of an embodiment with reference to the accompanying drawings in which.

DESCRIPTION OF THE PREFERRED EMBODIMENT

Figure 1:
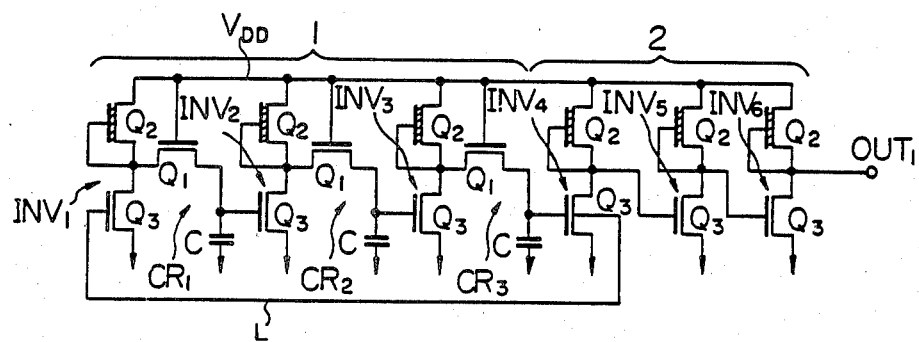
FIG. 1 is a circuit diagram illustrating an example of a conventional oscillation circuit.
Figure 2:
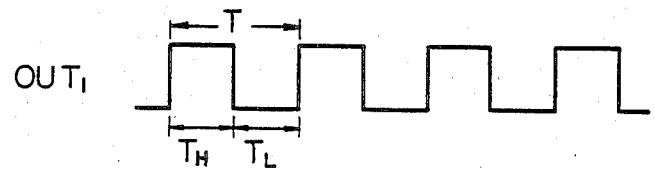
FIG. 2 is a diagram illustrating an output waveform at an output terminal of the circuit of FIG. 1.

Before describing the preferred embodiment, a conventional oscillation circuit will first be described, with reference to FIGS. 1 and 2. FIG. 1 is a circuit diagram of an example of a conventional oscillation circuit. FIG. 2 is a diagram of an output waveform at an output terminal of the circuit of FIG. 1. With reference to FIG. 1, the oscillation circuit is comprised of a delay circuit 1 and a waveform shaping circuit 2 connected to the output of the delay circuit 1. The delay circuit 1 includes three inverters $INV_1$ through $INV_3$ and three time constant circuits $CR_1$ through $CR_3$. Each of the three inverters $INV_1$ through $INV_3$ is comprised of a depletion type load MOS transistor $Q_2$ in which the gate is connected to the source, and an enhancement type driving transistor $Q_3$. The output of each inverter is connected to the CR time constant circuit $CR_1$, $CR_2$ or $CR_3$. Each of the CR time constant circuits $CR_1$ through $CR_3$ is comprised of an enhancement type MOS transistor $Q_1$ used as a resistance and a capacitance element C connected to the transistor $Q_1$. The output of the final stage time constant circuit $CR_3$ is fed back to the gate of the transistor $Q_3$ in the first stage inverter $INV_1$. The waveform shaping circuit 2 is comprised of three inverters $INV_4$ through $INV_6$. Each of the inverters $INV_4$ through $INV_6$ is comprised of a depletion type load transistor $Q_2$ and an enhancement type driving transistor $Q_3$. The first stage inverter $INV_4$ receives the output of the delay circuit 1. The final stage inverter INV₆ provides at the output terminal OUT₁ an oscillation output which has been shaped and the phase of which has been inverted from the phase of the input signal to the waveform shaping circuit 2.

In the operation of the delay circuit 1, when the first stage inverter INV₁ outputs a high potential, the capacitor C in the time constant circuit CR₁ connected to the output of the inverter INV₁ is charged through the transistor $Q_1$. In contrast with this, when the inverter INV₁ outputs a low potential, the same capacitor C is discharged through the same transistor $Q_1$. The other time constant circuits CR₂ and CR₃ operate in the same way as the circuit CR₁. By these charging and discharging operations, a signal applied to the input of the first inverter INV₁ is delayed by a predetermined time which is determined by the values of the resistances of the transistors $Q_1$ and the capacitances C. Also, since there are three inverters INV₁ through INV₃, i.e. an odd number of inverters, positive feedback is effected from the output of the final stage time constant circuit to the first stage inverter INV₁ through a conduction line L. Thus, an oscillation output having a predetermined period or a predetermined frequency is obtained at the output terminal OUT₁. The waveform shaping circuit 2 only shapes the gradually changing waveform outputted from the delay circuit 1 to obtain a rapidly changing waveform, and, if required, inverts the phase of the input signal. The phase inversion may be required depending on the construction of a bootstrap circuit which is to be connected to the output terminal OUT₁. Therefore, the waveform shaping circuit 2 does not directly relate to the oscillation.

It should be noted that, according to the conventional oscillation circuit as illustrated in FIG. 1, the time constant of the time constant circuit is the same in the two cases when the capacitance C is charged and when the capacitance C is discharged. That is, when the transistor $Q_1$ functions as pure resistance and the gate of the transistor $Q_1$ is connected to a power supply $V_{DD}$. Therefore, the time constant during charging is substantially the same as the time constant during discharging in each of the time constant circuits CR₁ through CR₃. As a result, the oscillation output obtained at the output terminal has a duty ratio substantially equal to 50%, as illustrated in FIG. 2. In FIG. 2, within one period T of the oscillation frequency, the interval $T_H$ of the high potential is equal to the interval $T_L$ of the low potential. As already described hereinbefore, such an oscillation signal having a duty ratio of 50% is not suitable, for example, for a programming circuit in an EPROM.

Figure 3:
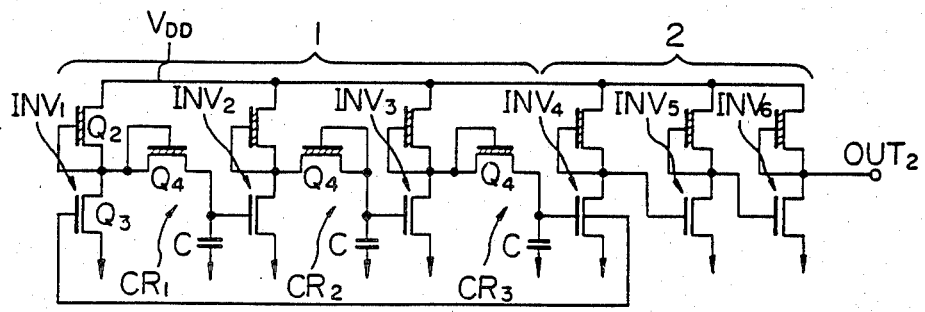
FIG. 3 is a circuit diagram illustrating an oscillation circuit according to one embodiment of the present invention.

An embodiment of the present invention will now be described in detail with reference to FIGS. 3 and 4. FIG. 3 is a circuit diagram illustrating an oscillation circuit according to one embodiment of the present invention, in which like reference characters designate the same or similar parts of the circuit of FIG. 1. The main difference between the circuit of FIG. 1 and the circuit of FIG. 3 resides in that, in place of the enhancement type MOS transistor $Q_1$ as a resistor in each of the time constant circuits CR₁ through CR₃ in the circuit of FIG. 1, a depletion type MOS transistor $Q_4$ is employed as a resistor in each of the time constant circuits CR₁ through CR₃ in the circuit of FIG. 3. Also, in place of connecting the gate of the enhancement type MOS transistor $Q_1$ to the power supply $V_{DD}$ as in FIG. 1, the gate of the depletion type MOS transistor $Q_4$ is connected to its drain or its source, as in FIG. 3. That is, in the time constant circuit CR₁ as an example, the gate of the transistor $Q_4$ is connected to its drain which is connected to the output of the first stage inverter INV₁. The capacitor C in each time constant circuit is constructed by a junction capacitance between the drain or the source and the semiconductor substrate of a depletion type MOS transistor $Q_4$, or by a MOS capacitance. By this construction, the equivalent resistance of the transistor $Q_4$, when its gate voltage varies from a low voltage L to a high voltage H, or in other words, when the output of the first stage inverter INV₁ is turned from a low potential L to a high potential H, is smaller than that when its gate voltage varies from H to L. Therefore, the time constant of the time constant circuit CR₁, during which the capacitance C is being charged, that is, when the voltage at the gate of the transistor $Q_4$ is being increased from L to H, is smaller than the time constant during which the capacitance C is being discharged, that is, when the voltage at the gate of the transistor $Q_4$ is being decreased from H to L. As a result, the transition time required to change from L to H the output voltage of the time constant circuit CR₁, that is, the voltage across the capacitance C, is smaller than the transition time required to change from H to L the output voltage of the time constant circuit CR₁. Similarly, in the other time constant circuits CR₂ and CR₃, the above mentioned different transition times can be obtained with respect to the changes of the output voltages of these circuits.

It should be noted that, in the second stage time constant circuit CR₂, the gate of the transistor $Q_4$ is not connected to the input of this time constant circuit CR₂, that is, to the drain of the transistor $Q_4$, but is connected to the output of the circuit CR₂, that is, to the source of the transistor $Q_4$. In such a way, the gate of the transistor $Q_4$ is connected alternately to the drain or to the source in the successive time constant circuits, respectively. By this construction, the delay times of all the time constant circuits are added. In the embodiment of FIG. 3, since three time-constant circuits CR₁ through CR₃ are provided, the total delay time is three times the delay time obtained by one CR time constant circuit. Thus, an oscillation frequency having a duty ratio sufficiently different from 50% can be obtained at the output terminal OUT₂ of the oscillation circuit of FIG. 3.

If all of the gates of the transistors $Q_4$ were connected to the same side, that is, to the input side or to the output side, of their time constant circuits, respectively, the differences in the delay times would be cancelled by each other, because the neighbouring two inverters operate inversely to each other. That is, if there are an even number of time constant circuits, the differences in delay times would be completely cancelled, and, if there are an odd number of time constant circuits, only one delay time obtained by one CR time constant circuit is left and the difference in the other delay times are cancelled. Therefore, if all of the gates of the transistors $Q_4$ were connected to the same sides, the duty ratio of the output frequency would not be significantly different from 50%.

Figure 4:
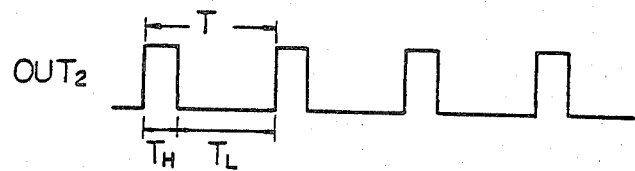
FIG. 4 is a diagram illustrating an output waveform at an output terminal of the circuit of FIG. 3.

FIG. 4 is a diagram illustrating an output waveform at an output terminal of the circuit of FIG. 3. As illustrated in FIG. 4, the interval $T_H$ of the high potential is shorter than the interval $T_L$ of the low potential. Therefore, the duty ratio $[T_H/(T_H+T_L)] \times 100$ is different from 50%. It will be apparent that the high potential interval $T_H$ can be made longer than the low potential interval $T_L$ by taking out the oscillation output from the output of the second inverter $INV_5$ in the waveform shaping circuit 2. Whether the high potential interval $T_H$ should be shorter or longer than the low potential interval $T_L$ is dependent on the construction of the bootstrap which is to be controlled by the oscillation circuit of FIG. 3.

Figure 5:
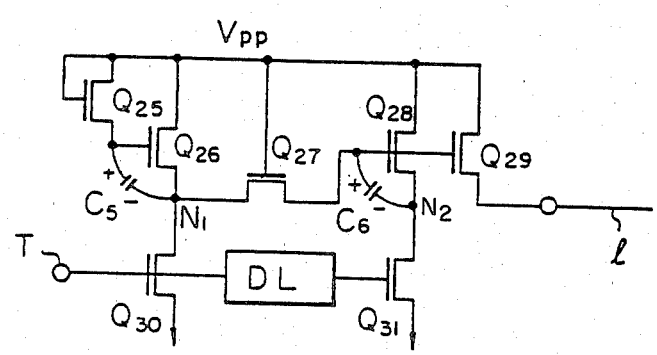
FIG. 5 is a circuit diagram illustrating a part of a write-in circuit in an EPROM which is to be connected to the output of the circuit of FIG. 3.

FIG. 5 is a circuit diagram illustrating a part of a write-in circuit in an EPROM which is to be connected to the output of the circuit of FIG. 3. In FIG. 5, 1 represents a conduction line, or a bit line, connected to memory cells in the PROM; $V_{PP}$ represents a high power supply voltage of, for example, 25 V for writing data in the PROM; $Q_{29}$ represents a transistor for controlling the power supply voltage $V_{PP}$ to connect to or disconnect from the conduction line 1, the gate of the transistor $Q_{29}$ being controlled by two stages within the bootstrap circuits; $C_5$ and $C_6$ represent the capcitances of the bootstrap circuits; $Q_{25}$ through $Q_{28}$ represent the transistors of the bootstrap circuit; $Q_{30}$ and $Q_{31}$ represent transistors for controlling the bootstrap circuit; DL represents a delay circuit; and T represents a control terminal for receiving the oscillation frequency from the output terminal $OUT_2$ of the circuit of FIG. 3.

In the operation of the circuit of FIG. 5, when the input voltage at the control terminal T becomes high H, the transistor $Q_{30}$ turns on so that the capacitor $C_5$ is charged by the power supply voltage $V_{PP}$ through the transistor $Q_{25}$ to have a polarity as illustrated. Also, after a time delay determined by the delay circuit DL, the transistor $Q_{31}$ is turned on so that the capacitor $C_6$ is discharged through transistors $Q_{27}$ and $Q_{30}$ to the ground potential. The transistor $Q_{29}$ receives at its gate the voltage across the capacitor $C_6$. The voltage across the capacitor $C_6$, when the transistors $Q_{30}$ and $Q_{31}$ are on, is not sufficient to turn on the transistor $Q_{29}$. Therefore, when the voltage at the control terminal T is high H, the conduction line 1 is separated from the power supply voltage $V_{PP}$.

When the input voltage at the control terminal T becomes low L, the transistor $Q_{30}$ turns off, so that the potential at the node $N_1$ increases. Since the potential at the gate of the transistor $Q_{26}$ is higher than the potential at the node $N_1$ by the voltage across the capacitance $C_5$, the transistor $Q_{26}$ is driven to be completely turned on. Thus, the potential at the node $N_1$ increases to a voltage nearly equal to the power supply voltage $V_{PP}$ without being decreased by the threshold voltage $V_{TH}$ of the transistor $Q_{26}$. The voltage at the node $N_1$ is applied through the transistor $Q_{27}$ to the capacitance $C_6$ to charge it, as well as to the gate of the transistor $Q_{29}$ to turn it on. Thus, the potential of the conduction line 1 begins to increase. After the time delay of the delay circuit DL, the gate of the transistor $Q_{31}$ receives the low voltage L so that the transistor $Q_{31}$ turns off. Then, the potential at the node $N_2$ increases. The potential at the gate of the transistor $Q_{28}$ and the node $N_2$ then rises higher by the voltage across the capacitance $C_6$, resulting in the further increase of the potential at the node $N_2$ to a value nearly equal to the power supply voltage $V_{PP}$. Also, the potential at the gates of the transistors $Q_{28}$ and $Q_{29}$ becomes higher than the prior potential at the node $N_2$. Then, the transistor $Q_{27}$ is turned off. Thus, the potential of the conduction line 1 increases to the power supply voltage $V_{PP}$. This operation, as described with reference to FIG. 5, is well known as a bootstrap circuit operation.

When the potential of the conduction line 1 is high H, or, in other words, when the potential at the control terminal T which receives control signals from the output terminal $OUT_2$ of the circuit of FIG. 3 is low L, data is written in the PROM. That is, when the potential of the conduction line 1 is high H, each cell in the PROM receives between its source and drain a high voltage to cause an avalanche breakdown in the cell. The avalanche breakdown produces hot electrons or holes which are then injected into the floating gate of the cell.

When data is to be read out from the PROM, the transistor $Q_{29}$ is turned off so that the conduction line 1 is disconnected from the power supply voltage $V_{PP}$, because, in the reading operation, the potential of the conduction line 1 is not required to be as high as the power supply voltage $V_{PP}$.

When external light rays are incident through a window (not shown) of a package containing the EPROM, electron-hole pairs are generated in the silicon semiconductor substrate of the EPROM. Because the capacitances $C_5$ and $C_6$ in the bootstrap circuit of FIG. 5 used for writing data in the EPROM are constructed by junction capacitances or MOS capacitances, charges stored in these capacitances $C_5$ and $C_6$ leak out due to the generation of the electron-hole pairs within a time of, for example, about 1 millisecond, while several ten milliseconds are required to write data in the PROM. Therefore, these capacitances are required to be repeatedly charged to maintain the voltage across the capacitances $C_5$ and $C_6$. During the high potential interval $T_H$ of the oscillation output as illustrated in FIG. 4, these capacitances $C_5$ and $C_6$ are charged, while, during the low potential interval $T_L$, programming of the EPROM is possible. Thus, as illustrated in FIG. 4, the charging interval corresponding to the interval $T_H$ is shorter than the programmable interval corresponding to the interval $T_L$.

It should be stated that although three stages of CR time constant circuits are included in the oscillation circuit of this embodiment, the number of stages is not restricted to three, but may be any number as long as the time constant satisfies the required charging time. Also, the number of stages of the inverters are not restricted to six as illustrated, but may be any number, and is dependent only on the construction of the bootstrap circuit which is to be connected to the oscillation circuit.

From the foregoing description, according to the present invention, since the oscillation circuit can provide the oscillation frequency having a duty ratio different from 50%, it will be apparent that the write-in efficiency is greatly improved when the oscillation circuit is adapted to, for example, a bootstrap circuit in an EPROM of a type erasable by means of ultraviolet rays.

I claim:

1. An oscillator circuit for providing an oscillating output having a duty ratio significantly different from 50%, comprising
    a delay circuit, the output of said delay circuit being provided to the input of said delay circuit as positive feedback,
    said delay circuit including a plurality of successively connected delay stages, wherein a signal corresponding to the output of each said delay stage is provided to the input of the successive delay stage, and a signal corresponding to the output of the last one of said delay stages is provided as said positive feedback to the input of the first one of said delay stages, each said delay stage comprising a series connection of an inverter and a time constant circuit, each said time constant circuit comprising a resistance provided by a first depletion type MOS transistor and a capacitor connected in series, each said first depletion type MOS transistor being connected so that a difference in the delay time is provided within each said delay stage depending upon whether the portion of a signal being delayed is a rising or falling waveform, the respective connection of each said first depletion type MOS transistor of each said delay stage being such that all the differences in all the stages are added to provide said duty ratio significantly different from 50%.

2. The circuit of claim 1, comprising an odd number of said delay stages, and each said first depletion type MOS transistor having its source connected to said capacitor and its drain connected to the output of the respective inverter, and the gate of each successive first depletion type MOS transistor of said successive stages being connected alternately to the source and the drain thereof.

3. The circuit of claim 2, comprising each said inverter including a second depletion type MOS transistor as a load and an enhancement type MOS transistor connected in series with said load, and the gate and the source of each said second depletion type MOS transistor being connected in common to provide the output of the respective inverter.

4. The circuit of claim 1, 2, or 3, each said capacitor being provided by the junction capacitance between the source and the semiconductor substrate of each said first depletion type MOS transistor.

5. The circuit of claim 1, 2, or 3, each said capacitor being provided by a respective MOS capacitance that is provided in each respective time constant circuit.

6. The circuit of claim 1, 2 or 3 comprising a waveform shaping circuit connected to the output of said delay circuit, and a bootstrap circuit connected to receive as an input the output of said waveform shaping circuit, wherein said input to said bootstrap circuit is a rapidly changing waveform.

* * * * *

UNITED STATES PATENT AND TRADEMARK OFFICE
CERTIFICATE OF CORRECTION

PATENT NO. : 4,408,168

DATED : October 4, 1983

INVENTOR(S) : M. Higuchi

It is certified that error appears in the above-identified patent and that said Letters Patent is hereby corrected as shown below:

Col. 2, line 15, delete "," after "circuit".
Col. 39, line 3, change "Q₁functions" to --Q₁ functions--.
Col. 5, lines 9, 15, 37, 51, 63 and 67, change "1" to --$\ell$--.
Col. 6, lines 4, 11 and 14, change "1" to --$\ell$--.

Signed and Sealed this

Seventh Day of August, 1990

Attest:

HARRY F. MANBECK, JR.

*Attesting Officer*  *Commissioner of Patents and Trademarks*